Figure 1:
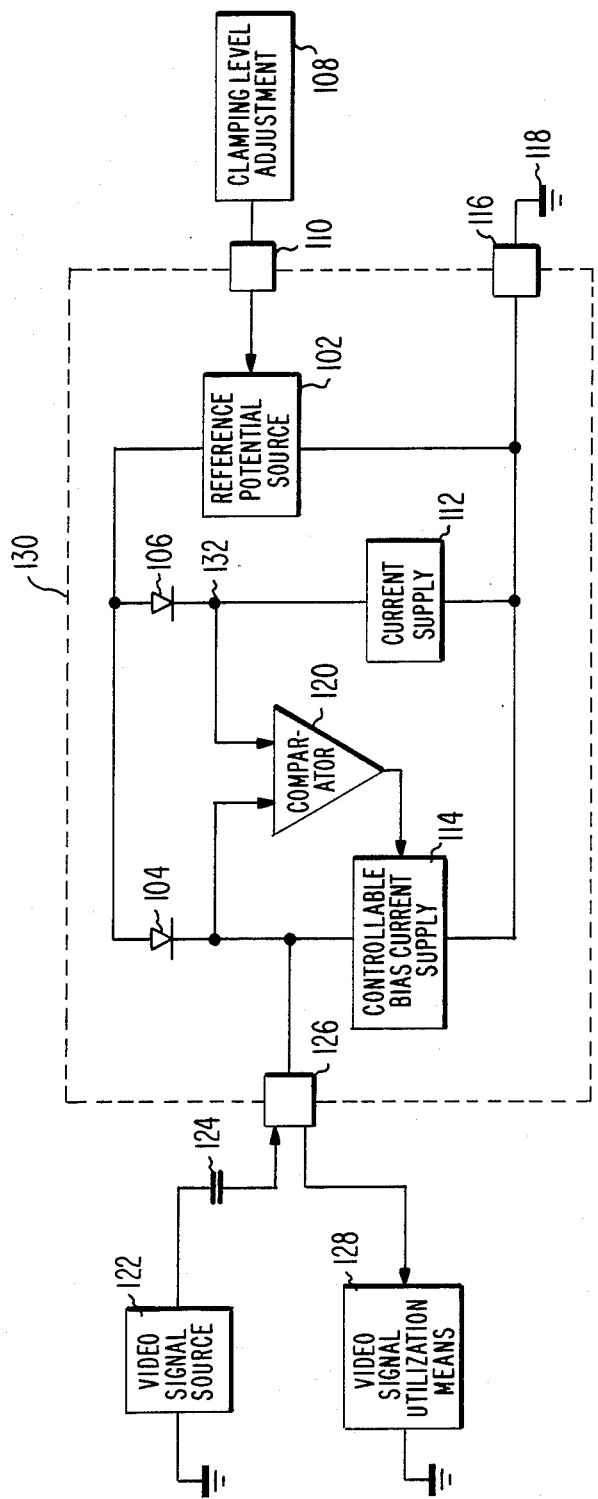

United States Patent [19]

Ahmed

[11] Patent Number: 4,644,198

[45] Date of Patent: Feb. 17, 1987

[54] SIGNAL CLAMP

[75] Inventor: Syed M. Ahmed, Hillsborough, N.J.

[73] Assignee: RCA Corporation, Princeton, N.J.

[21] Appl. No.: 666,860

[22] Filed: Oct. 31, 1984

[51] Int. Cl.$^4$ .............................................. H03K 5/08
[52] U.S. Cl. .................................... 307/549; 307/555;
307/264; 307/362
[58] Field of Search ............... 307/540, 565, 264, 304,
307/355, 362, 561, 549, 555; 358/139, 170, 171,
307/172, 173, 174; 330/11, 254, 253

[56]  References Cited
U.S. PATENT DOCUMENTS

| | | | |
|---|---|---|---|
| 3,755,693 | 8/1973 | Lee | 307/562 |
| 3,822,408 | 7/1974 | Veranth | 330/99 |
| 4,027,177 | 5/1977 | Davis | 307/237 |
| 4,293,874 | 10/1981 | Reneau | 358/171 |
| 4,386,369 | 5/1983 | Shanley, II et al. | 358/172 |
| 4,443,717 | 4/1984 | Hague | 307/565 |
| 4,551,642 | 11/1985 | Aizawa et al. | 307/562 |
| 4,556,805 | 12/1985 | Shoji | 307/362 |

Primary Examiner—John Zazworsky
Attorney, Agent, or Firm—Paul J. Rasmussen; Peter M. Emanuel; Adel A. Ahmed

[57] ABSTRACT

A semiconductor junction clamps a signal to a reference potential. A comparator senses the difference between the reference potential and the signal potential and causes a controllable bias current supply to selectively apply a forward bias to the junction when the signal is of a polarity sense tending to forward bias the junction.

7 Claims, 2 Drawing Figures

SIGNAL CLAMP

The present invention relates to the field of apparatus for clamping a signal at a reference potential level.

The image representative signals derived from, for example, an image pickup device, a television video game, a recording playback device, or a computer video output generally require certain processing in order to prepare them for transmission to a signal receiving and image reproducing device. Such processing usually includes appropriate clamping to a reference potential level. In a typical television signal, for example, it is commonly desired that the peak excursions or tips of the sync signals be clamped to a reference potential level, usually referred to as the sync tip clamping level.

In certain cases, it may be desirable to "unclamp" the video signal, such as by coupling through a capacitor, and then clamping to a new level. For example, this may arise because the video signal as provided is clamped to an unsuitable level or at a level which varies, or because it is desired to allow a user the flexibility of adjusting the clamping level as may be required by different signal processing apparatus to which the signal may be supplied. In the common example where a video signal is applied to a radio frequency (RF) modulator, proper setting of the clamping level is important. If the clamping level is set too low or too high, the video signal may exceed the modulator's operating range or the video signal may fall below the level for zero modulation, thus causing the RF carrier effectively to have zero amplitude. For similar reasons, it is important that the clamping level be well defined and that it continue to hold closely to its set value.

Semiconductor diodes are commonly used to provide sync tip clamping at a reference potential. The signal is generally coupled through a series capacitor to a diode which conducts to charge the capacitor when a sync tip level exceeds the reference potential. However, a semiconductor diode generally does not exhibit an abrupt transition from a non-conducting state to a conducting state, but rather, there is a gradual increase in conduction current as the forward bias voltage is increased, i.e. the characteristic is "soft". In a clamping circuit, this causes the clamping level to be poorly defined and subject to variation. Since the diode characteristic is less "soft" at higher currents, it is possible to apply a forward bias current, for example by resistor which slowly discharges the capacitor. However, if the attempted improvement is carried too far by increasing the discharge current, the capacitor discharge rate will no longer be slow in comparison with the signal period and significant signal "droop", or amplitude change within one signal period will begin to occur. Excessive signal droop may cause problems in many applications and generally is undesired.

In accordance with an aspect of the invention, a semiconductor junction is coupled between a source of a reference potential and a signal connection for receiving a signal to be clamped. A comparator senses the potential difference between the reference potential and the potential at the signal connection. The comparator output signal controls a controllable bias current supply coupled to the signal connection for selectively applying a first bias current in a polarity sense to forward bias the semiconductor junction when the signal to be clamped is of a polarity sense tending to forward bias the semiconductor junction.

In accordance with a further aspect of the invention, the controllable bias current supply applies a second bias current, smaller than the first bias current when the signal to be clamped is of a polarity sense tending to reverse bias the semiconductor junction.

Figure 2:
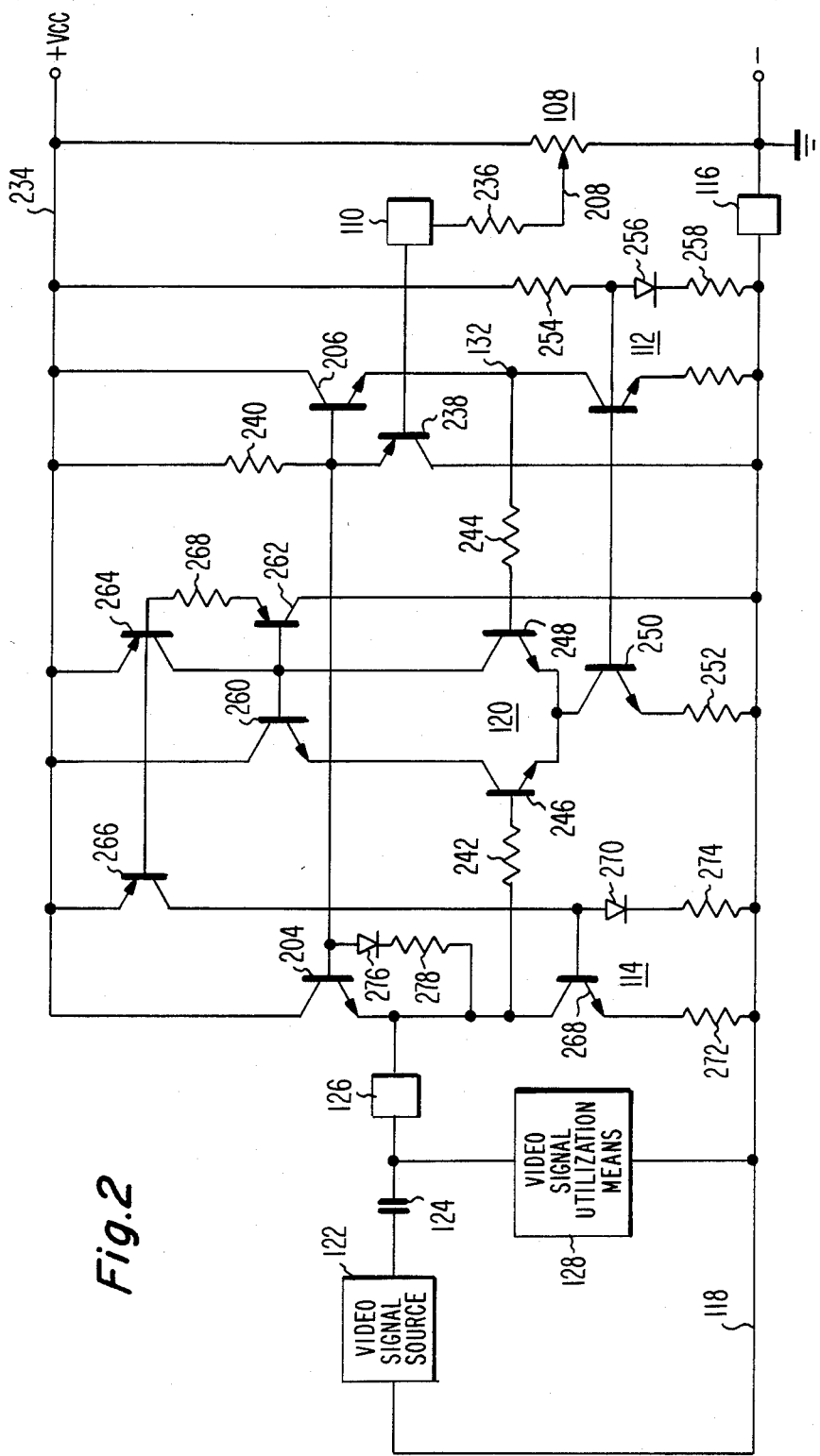

These and other aspects of the invention will be explained with reference to the accompanying drawing in which:

FIG. 1 shows in block form a schematic of a signal processing arrangement including a preferred embodiment of the present invention; and FIG. 2 shows in detail circuit form a schematic of an implementation of the signal processing arrangement shown in FIG. 1.

In the clamp circuit of FIG. 1, 102 is a reference potential source for applying a reference potential to the respective anodes of semiconductor diodes 104 and 106. The value of the reference potential is controlled by a clamping level adjustment arrangement indicated as block 108 which is coupled to reference potential source 102 by way of a terminal 110. A controllable bias current supply 114 is connected to the cathode of diode 104 and a current supply 112 is connected to the cathode of diode 106. Reference potential source 102, current supply 112 and controllable bias current supply 114 have respective common connections by way of a terminal 116 to a common potential, here, for example, shown as a ground 118. A comparator 120 which is coupled to sense the potential difference between the respective cathodes of diode 104 and diode 106 produces an output signal indicative of the potential difference. Variations of the forward bias diode drop or offset voltage of diode 104 will not significantly affect the comparison since the offset is compensated by the offset of diode 106. This output signal is coupled to a control input of controlled bias current supply 114. The signal to be clamped is supplied from a video signal source 122 by way of a coupling capacitor 124 to a terminal 126 which is coupled to the cathode of diode 104. The clamped signal, which is available at terminal 126 is supplied to a video signal utilization means 128.

Dashed line 130 indicates by way of example convenient partitioning in the case where the clamp circuit is included in an integrated circuit. Naturally, if other portions of a system are included in the same integrated circuit, the partitioning may be different.

Comparator 120 and controllable bias current supply 114 are so arranged that when the potential on node 132 is more positive than the potential on terminal 126 (indicating that the input signal is of a polarity tending to forward bias diode 104), controllable bias current supply 114 applies a bias current to diode 104 in a polarity sense to forward bias diode 104. The magnitude of the bias current is selected so as to bias diode 104 well into its forward conduction region, in comparison with the extent of its forward biasing that would occur on account of the applied signal from video signal source 122 in the absence of the bias current. Negative-going excursions of the input signal cause additional conduction in diode 104. However, because of the conduction already taking place due to the bias current, the negative-going signal excursions do not cause much change in the diode forward drop. Negative-going signal excursions are therefore clamped at their most negative potential at terminal 126, capacitor 124 being thereby charged to the peak value of the negative signal excursion. On positive signal excursions, signal terminal 126 becomes more positive than node 132 (indicating that the input signal is of a polarity tending to reverse bias diode 104), which condition is detected by comparator 120. The output signal of comparator 120 causes controllable bias current supply 114 to apply a significantly smaller current to signal terminal 126, causing the current in diode 104 to drop significantly. The positive signal excursion further cuts off conduction in diode 104, leaving the potential on signal terminal 126 free to increase with the positive-going signal. Since the current applied by controllable bias current supply 114 during positive signal excursions is relatively small, no significant discharging of capacitor 124 takes place and no significant amount of signal "droop" occurs. The signal available to video signal utilization means 128 from signal terminal 126 is essentially the same as that applied by video signal source 122 except that its negative peaks are clamped at a potential equal to the cathode potential of diode 104 in its heavily conductive state.

In the signal clamp of FIG. 2, the same reference numerals have been carried over from FIG. 1 to designate corresponding elements, while equivalent elements are designated in both Figures by reference numerals having the same two least significant digits. In FIG. 2, a clamping level adjustment 108 comprises a potential divider 208 coupled between a +Vcc line 234 and ground 116. The adjustable potential on the wiper of potential divider 208 is applied by way of a resistor 236 and terminal 110 to the base of a PNP transistor 238 which is operated as an emitter follower with a load resistor 240 and with its collector coupled to the ground connection terminal 116. The emitter of transistor 238 is connected to the base electrodes of two NPN transistors 204 and 206 (corresponding in function to diodes 104 and 106 shown in FIG. 1), both of which are operated with emitter loads and with collectors coupled to the +Vcc line 234. When transistors 204 and 206 are conducting normal emitter currents, their emitter potentials will be closely equal to the potential at terminal 110, since the offset produced by their base-emitter forward drops closely compensates for the base-emitter drop of transistor 238. The emitters of transistors 204 and 206 are respectively coupled by way of resistors 242 and 244 to the respective bases of NPN transistors 246 and 248 which form a differential pair (corresponding in function to comparator 120 shown in FIG. 1), with current being supplied to their joined emitters by an NPN transistor 250. Transistor 250 together with a resistor 252 forms a current mirror amplifier configuration with a diode 256 and a resistor 258, with the input current to this current mirror amplifier configuration being supplied by a resistor 254 from the +Vcc line 234. The transistor-resistor connection 112 forms a further output of the current mirror amplifier configuration and supplies transistor 206 emitter with operating current. The collector output current of transistor 248 is combined with the base current of transistor 260 in a current mirror amplifier comprising PNP transistors 262, 264, 266 and resistor 268 to produce a current output at the collector of transistor 266. This current mirror amplifier is so arranged that when the collector current of transistor 248 is very small or zero, a relatively small current is supplied by transistor 266 collector. This arises because of the base current of transistor 260 which is small, because it is equal to the collector current of transistor 246 divided by the current gain of transistor 260, and which will be mirrored by the current mirror comprising transistors 260, 262 and 264. The collector current of transistor 266 is applied to a further current mirror amplifier 114 (corresponding in function to controllable bias current source 114 shown in FIG. 1) which comprises transistor 268 diode 270 and resistors 272 and 274. The collector current of transistor 268 is applied to terminal 126 which is connected to the emitter of transistor 204.

When the video signal applied by video signal source 122 by way of capacitor 124 to signal terminal 126 undergoes a negative excursion, comparator 120 senses that the emitter of transistor 204 is at a more negative potential than the emitter of transistor 206 (indicating that the base-emitter junction of transistor 204 is tending toward forward bias). This causes transistor 248 to conduct a greater collector current than transistor 246 which, in turn, increases the collector currents of transistors 266 and 268. The collector current demand of transistor 268 is met by increased emitter current in transistor 204, which is thus biased into heavier conduction. Because of this heavier conduction, the base-emitter forward drop of transistor 204 is not much affected by current flow in transistor 204 due to the negative signal excursion itself. The signal on signal terminal 126 is therefore effectively clamped at the emitter potential of transistor 204 which is in a state of relatively heavy conduction.

When a positive excursion occurs in the input signal (indicating that the base-emitter junction of transistor 204 is tending toward reverse bias), comparator 120 is unbalanced with the base of transistor 246 being more positive than the base of transistor 248. This leads to a reduction in the collector current of transistor 268. However, in this illustrative embodiment, the collector current of transistor 268 does not drop indefinitely but remains at a relatively small value, due to the base current of transistor 260 which is somewhat increased by this unbalance condition. This base current is mirrored by transistors 266 and 264 and causes transistor 268 to continue to conduct a relatively small current. However, this current is small enough not to cause any significant "droop" in the input signal. It is nevertheless sufficient to ensure that in the absence of an input signal, the potential of signal connection 126 will remain at a quiescent value corresponding approximately to the reference potential on terminal 110.

Thus, negative-going signal excursions are clamped by relatively heavily conducting transistor 204. However, transistor 204 is caused to conduct relatively lightly for positive-going excursions. Conduction by transistor 204 on the negative excursions will charge capacitor 124 such that the signal available at terminal 126 is a relatively faithful replica of the signal supplied by video signal source 122, except that negative peak excursions are clamped at a potential closely determined by the reference potential on terminal 110.

It is desirable for practical reasons to limit the current that can be drawn from the emitter of transistor 204. To this end, a series combination of a diode 276 and a resistor 278 is connected across the base emitter junction of transistor 204. When transistor 204 emitter current becomes large, causing its base-emitter drop to increase, the current through diode 276 starts to reach a significant value compared with the base current of transistor 204. However, the available current is limited due to resistor 240. The more significant current in diode 276 therefore constitutes a significant diversion of base current from transistor 204 which accordingly causes its emitter current to be limited.

Clearly, the implementation of tne invention in accordance with FIGS. 1 and 2 is illustrative. Various modifications to the circuitry for implementing the invention in accordance with the foregoing description will readily suggest themseleves to one skilled in the art. For example, the choice of ground as a common reference potential and the illustrated polarity senses of diodes 104 and 106 of FIG. 1 and conduction types of transistors 204 and 206 may be modified to suit a particular application. In addition while the operation of the invention has been described with reference to a video signal, the invention may also be used to clamp other types of signals. These and other modifications are contemplated to be within the scope of the present invention.

What is claimed is:

1. A clamp circuit for clamping an information signal to a predetermined potential level, comprising:
   a signal connection for receiving said information signal;
   source means for providing a reference potential level;
   semiconductor junction means coupled between said source means and said signal connection;
   comparator means having first and second inputs coupled to said signal connection and to said source means, respectively, for sensing the potential difference therebetween and having an output for providing an output signal indicative of said potential difference; and
   controllable bias current supply means having an output coupled to said signal connection and having a control input coupled to said output of said comparator means, said controllable bias current supply means being responsive to said comparator output signal for selectively applying a first bias current in a polarity sense to forward bias said semiconductor junction means when said information signal is of a polarity sense tending to forward bias said semiconductor junction means for clamping said information signal substantially at said predetermined potential level.

2. The apparatus recited in claim 1 wherein said controllable current supply means is responsive to said comparator output signal for applying a second bias current when said information signal is of a polarity sense tending to reverse bias said semiconductor junction, said second bias current being smaller than said first bias current.

3. The apparatus recited in claim 2 wherein said semiconductor junction means comprises the base-emitter junction of a transistor having emmitter, base and collector electrodes, wherein said emitter electrode is coupled to said signal connection, said base electrode is coupled to said source means and said collector is coupled to a source of operating potential.

4. The apparatus recited in claim 3 wherein said semiconductor means further comprises current limiting means for preventing the current through said emitter electrode from exceeding a predetermined upper limit.

5. The apparatus recited in claim 4 wherein said comparator means includes voltage offset means for offsetting the voltage drop occurring across said base-emitter junction when said junction is forward biased.

6. The apparatus recited in claim 4 wherein said controllable bias current supply means comprises a current mirror amplifier including an input coupled for receiving said comparator output signal.

7. The apparatus recited in claim 1 wherein said information signal is capacitively coupled to said signal connection.

* * * * *